United States Patent
Xiao et al.

(10) Patent No.: US 9,160,116 B2
(45) Date of Patent: Oct. 13, 2015

(54) CONNECTOR AND ELECTRONIC DEVICE

(71) Applicant: Huawei Technologies Co., Ltd., Shenzhen, Guangdong (CN)

(72) Inventors: Congtu Xiao, Shenzhen (CN); Zhigang Zhao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 79 days.

(21) Appl. No.: 14/034,142

(22) Filed: Sep. 23, 2013

(65) Prior Publication Data

US 2014/0134879 A1 May 15, 2014

Related U.S. Application Data

(63) Continuation of application No. PCT/CN2013/074270, filed on Apr. 16, 2013.

(30) Foreign Application Priority Data

Nov. 12, 2012 (CN) .......................... 2012 1 0450492

(51) Int. Cl.
*H01R 24/64* (2011.01)
*H01R 13/66* (2006.01)
*H01R 12/73* (2011.01)

(52) U.S. Cl.
CPC .............. *H01R 13/665* (2013.01); *H01R 12/73* (2013.01)

(58) Field of Classification Search
CPC ....... H01R 24/64; H01R 13/665; H01R 24/40
USPC ............................................ 439/620.15, 752
See application file for complete search history.

(56) References Cited

U.S. PATENT DOCUMENTS

| | | | | |
|---|---|---|---|---|
| 3,411,097 A | * | 11/1968 | Hinrichs | 330/9 |
| 4,882,554 A | * | 11/1989 | Akaba et al. | 333/105 |
| 6,409,547 B1 | * | 6/2002 | Reede | 439/676 |
| 6,932,649 B1 | | 8/2005 | Rothermel et al. | |
| 7,517,236 B2 | * | 4/2009 | Koyama | 439/129 |
| 2004/0266224 A1 | * | 12/2004 | Watson | 439/66 |
| 2006/0216969 A1 | | 9/2006 | Bright et al. | |
| 2011/0287633 A1 | | 11/2011 | Lee et al. | |
| 2011/0287663 A1 | | 11/2011 | Gailus et al. | |
| 2012/0028502 A1 | | 2/2012 | Yeh et al. | |
| 2012/0094536 A1 | | 4/2012 | Khilchenko et al. | |
| 2013/0288526 A1 | * | 10/2013 | Rascon et al. | 439/607.35 |
| 2013/0323974 A1 | * | 12/2013 | Gutierrez et al. | 439/620.15 |
| 2014/0307809 A1 | * | 10/2014 | Lo | 375/257 |

FOREIGN PATENT DOCUMENTS

| | | |
|---|---|---|
| CN | 2842776 Y | 11/2006 |
| CN | 1881699 A | 12/2006 |

(Continued)

*Primary Examiner* — Truc Nguyen

(57) ABSTRACT

The present invention discloses a connector, including: a first interface, a second interface, and a signal boost circuit, where at least one of the first interface and the second interface includes a power supply contact head, and the power supply contact head is configured to power the signal boost circuit; and a casing, where the signal boost circuit is arranged inside the casing and concatenated between the first interface and the second interface, and the signal boost circuit performs signal amplification processing on a differential signal received by the first interface and outputs the signal over the second interface, and the first interface and the second interface are arranged on different surfaces outside the casing. Further, the present invention discloses an electronic device.

16 Claims, 15 Drawing Sheets

(56) References Cited

FOREIGN PATENT DOCUMENTS

| CN | 200979960 A | 11/2007 |
| CN | 201639126 U | 11/2010 |
| CN | 202454842 U | 9/2012 |
| CN | 102969624 A | 3/2013 |

* cited by examiner

CONNECTOR AND ELECTRONIC DEVICE

CROSS-REFERENCE TO RELATED APPLICATIONS

This application is a continuation of International Application No. PCT/CN2013/074270, filed on Apr. 16, 2013, which claims priority to Chinese Patent Application No. 201210450492.5, filed on Nov. 12, 2012, both of which are hereby incorporated by reference in their entireties.

TECHNICAL FIELD

The present invention relates to the field of communications technologies, and in particular, to a connector and an electronic device.

BACKGROUND

Referring to FIG. 1, FIG. 1 is a schematic structural diagram of using a connector to connect a backplane and a circuit board in an electronic device in the prior art. As illustrated in FIG. 1, in the prior art, components forming a high-speed second circuit board link include a backplane 11, a circuit board 12, a circuit board 15, a connector 10, and a connector 14. The connector 14 is used to connect the backplane 11 to the circuit board 15, and the connector 10 is used to connect the backplane 11 to the circuit board 12. A chip 16 is arranged on the circuit board 12, a chip 13 is arranged on the circuit board 13, and internal circuit connection wires (not illustrated in FIG. 1) are arranged inside the backplane 11, the circuit board 12, the circuit board 15, the connector 14, and the connector 10. The connector 14 is connected to the backplane 11 and the circuit board 15. After the connector 10 is connected to the backplane 11 and the circuit board 12, an electrical connection is implemented between the chip 16 and the chip 13.

Referring to FIG. 2, FIG. 2 is a detailed circuit diagram of connections between a connector and a second circuit board as well as the circuit board in the prior art. FIG. 2 further illustrates detailed circuit connection relationships between the connector 10 and the backplane 11 and the circuit board 12 that are illustrated in FIG. 1. As illustrated in FIG. 2, the connector 10 includes conductive contact heads 101, 102, 103, and 104 (for clarity in FIG. 2, only the 4 contact heads are given as examples, and the actual number of contact heads is illustrated in FIG. 2), and conductive contact heads 105, 106, 107, and 108 (for clarity in FIG. 2, only the 4 contact heads are given as examples, and the actual number of contact heads is illustrated in FIG. 2). The conductive contact heads 101, 102, 103, and 104 are optionally pluggable into the backplane 11, the conductive contact heads 105, 106, 107, and 108 are optionally pluggable into the circuit board 12, an internal electrical connection is implemented between the conductive contact head 101 and the conductive contact head 108 in the connector 10, an internal electrical connection is implemented between the conductive contact head 102 and the conductive contact head 107 in the connector 10, an internal electrical connection is implemented between the conductive contact head 103 and the conductive contact head 106 in the connector 10, and an internal electrical connection is implemented between the conductive contact head 104 and the conductive contact head 105 in the connector 10. Therefore, when the circuit board 12 is connected to the backplane 11 by using the connector 10, a plurality of electrical connections may be formed between the backplane 11 and the circuit board 12, and data signals are transmitted over the plurality of electrical connections.

In the long-term research, the inventor of the present invention finds that the signal transmission speed of the high-speed second circuit board link is required to be higher and higher. For example, it will be increased from the current 10 Gbs to 17 Gbs gradually, and is predicted to be further increased from 17 Gbs to 25 Gbs. Under a high data transmission speed, signal attenuation will be higher and higher. Due to cabling loss restriction of traditional circuit boards, in order to implement a link with a speed of 25 Gbs, an M6 board material or a high-speed cable solution is required to control signal attenuation that occurs in the internal circuit connection wires. However, M6 board materials and high-speed cables are very expensive, increasing the costs. In addition, if high-speed cables are used instead of the foregoing connection manner, tens of thousands of lines on the second circuit board have to be replaced with cable connections. This extremely complicates the design solution.

Another solution in the prior art is to add a balancer on the circuit board 12 connected to the connector 10 to boost signal amplitude and control signal attenuation. However, due to the increasing integration of products, space on the circuit board 12 is scarce, and the balancer added on the circuit board 12 will increase the product size.

SUMMARY

The present invention aims to provide a connector and an electronic device to control signal attenuation under a high data transmission speed without leading to a size increase.

In one aspect, a connector is provided, including: a first interface, a second interface, and a signal boost circuit, where at least one of the first interface and the second interface includes a power supply contact head, and the power supply contact head is connected to an external power supply to power the signal boost circuit; and a casing, where the signal boost circuit is arranged inside the casing and concatenated between the first interface and the second interface, and the signal boost circuit performs signal amplification processing on a differential signal received by the first interface and outputs the signal over the second interface, and the first interface and the second interface are arranged on different surfaces outside the casing.

With reference to the implementation manner of the first aspect, in a first possible implementation manner, the first interface includes a first conductive contact head, a second conductive contact head, a third conductive contact head, and a fourth conductive contact head, where the first conductive contact head and the second conductive contact head are configured to receive a differential signal from outside of the casing, the third conductive contact head is configured to receive a ground signal from outside of the casing, and the fourth conductive contact head serves as the power supply contact head to receive a power supply from outside of the casing; the signal boost circuit includes a first input terminal, a second input terminal, a first output terminal, a second output terminal, a ground terminal, and a power input terminal, where the first input terminal is connected to the first conductive contact head, the second input terminal is connected to the second conductive contact head, the ground terminal is connected to the third conductive contact head, the power input terminal is connected to the fourth conductive contact head, and the signal boost circuit acquires the differential signal over the first input terminal and the second input terminal and performs signal amplification processing; and the second interface includes a fifth conductive contact head, a sixth conductive contact head, and a seventh conductive contact head, where the fifth conductive contact head is connected to the first output terminal, the sixth conductive contact head is connected to the second output terminal, the seventh conductive contact head is connected to the ground terminal, and the fifth conductive contact head and the sixth conductive contact head output the differential signal experiencing signal amplification processing performed by the signal boost circuit.

With reference to the first aspect, in a second possible implementation manner, the first interface includes a first conductive contact head, a second conductive contact head, and a third conductive contact head, where the first conductive contact head and the second conductive contact head are configured to receive a differential signal from outside of the casing, and the third conductive contact head is configured to receive a ground signal from outside of the casing; the signal boost circuit includes a first input terminal, a second input terminal, a first output terminal, a second output terminal, a ground terminal, and a power input terminal, where the first input terminal is connected to the first conductive contact head, the second input terminal is connected to the second conductive contact head, the ground terminal is connected to the third conductive contact head, and the signal boost circuit acquires the differential signal over the first input terminal and the second input terminal and performs signal amplification processing; and the second interface includes a fifth conductive contact head, a sixth conductive contact head, a seventh conductive contact head, and an eighth conductive contact head, where the fifth conductive contact head is connected to the first output terminal, the sixth conductive contact head is connected to the second output terminal, the seventh conductive contact head is connected to the ground terminal, the fifth conductive contact head and the sixth conductive contact head output the differential signal experiencing signal amplification processing performed by the signal boost circuit, and the eighth conductive contact head is connected to a power input terminal as the power supply contact head, and is configured to receive a power supply from outside of the casing.

With reference to the first or second possible implementation manner of the first aspect, in a third possible implementation manner, a coupling capacitor is arranged between the fifth conductive contact head and the first output terminal, and between the sixth conductive contact head and the second output terminal, so as to perform direct-current blocking for the differential signal experiencing signal amplification processing.

With reference to the first or second possible implementation manner of the first aspect, in a fourth possible implementation manner, the signal boost circuit is a balancer.

With reference to the first or second possible implementation manner of the first aspect, in a fifth possible implementation manner, a voltage value of the power supply is 1.8 V or 3.3 V.

A second aspect provides an electronic device, which includes a first circuit board, a second circuit board, and a connector, where the connector includes: a first interface, a second interface, and a signal boost circuit, where at least one of the first interface and the second interface includes a power supply contact head, and the power supply contact head contacts an external power supply to power the signal boost circuit; and a casing, where the signal boost circuit is arranged inside the casing and concatenated between the first interface and the second interface, the signal boost circuit performs signal amplification processing on a differential signal received by the first interface and outputs the signal over the second interface, and the first interface and the second interface are arranged on different surfaces outside the casing; and a power output terminal is arranged on at least one of the first circuit board and the second circuit board, and the power supply contact head is connected to the power output terminal to acquire a power supply from the power output terminal to power the signal boost circuit.

With reference to the implementation manner of the second aspect, in a first possible implementation manner, the first interface includes a first conductive contact head, a second conductive contact head, a third conductive contact head, and a fourth conductive contact head, where the first conductive contact head and the second conductive contact head are configured to receive a differential signal from the first circuit board, the third conductive contact head is configured to receive a ground signal from the first circuit board, and the fourth conductive contact head serves as the power supply contact head to receive a power supply that is output from the power output terminal of the first circuit board; the signal boost circuit includes a first input terminal, a second input terminal, a first output terminal, a second output terminal, a ground terminal, and a power input terminal, where the first input terminal is connected to the first conductive contact head, the second input terminal is connected to the second conductive contact head, the ground terminal is connected to the third conductive contact head, the power input terminal is connected to the fourth conductive contact head, and the signal boost circuit acquires the differential signal over the first input terminal and the second input terminal and performs signal amplification processing; and the second interface includes a fifth conductive contact head, a sixth conductive contact head, and a seventh conductive contact head, where the fifth conductive contact head is connected to the first output terminal, the sixth conductive contact head is connected to the second output terminal, the seventh conductive contact head is connected to the ground terminal to receive a ground signal from the second circuit board, and the fifth conductive contact head and the sixth conductive contact head output the differential signal experiencing signal amplification processing performed by the signal boost circuit to the second circuit board.

With reference to the implementation manner of the second aspect, in a second possible implementation manner, the first interface includes a first conductive contact head, a second conductive contact head, and a third conductive contact head, where the first conductive contact head and the second conductive contact head are configured to receive a differential signal from the first circuit board, and the third conductive contact head is configured to receive a ground signal from the first circuit board; the signal boost circuit includes a first input terminal, a second input terminal, a first output terminal, a second output terminal, a ground terminal, and a power input terminal, where the first input terminal is connected to the first conductive contact head, the second input terminal is connected to the second conductive contact head, the ground terminal is connected to the third conductive contact head, and the signal boost circuit acquires the differential signal over the first input terminal and the second input terminal and performs signal amplification processing; and the second interface includes a fifth conductive contact head, a sixth conductive contact head, a seventh conductive contact head, and an eighth conductive contact head, where the fifth conductive contact head is connected to the first output terminal, the sixth conductive contact head is connected to the second output terminal, the seventh conductive contact head is connected to the ground terminal to receive a ground signal from the second circuit board, the fifth conductive contact head and the sixth conductive contact head output the differential signal experiencing signal amplification processing performed by the signal boost circuit to the second circuit board, and the eighth conductive contact head serves as a power supply contact head to receive a power supply that is output from the power output terminal of the second circuit board.

With reference to the first or second possible implementation manner of the second aspect, in a third possible implementation manner, a coupling capacitor is arranged between the fifth conductive contact head and the first output terminal, and between the sixth conductive contact head and the second output terminal, so as to perform direct-current blocking for the differential signal experiencing signal amplification processing.

With reference to the first or second possible implementation manner of the second aspect, in a fourth possible implementation manner, the signal boost circuit is a balancer.

With reference to the first or second possible implementation manner of the second aspect, in a fifth possible implementation manner, a voltage value of the power supply is 1.8 V or 3.3 V.

A third aspect provides a connector, including at least one conductor assembly, a casing, and a signal boost circuit, where the signal boost circuit is arranged inside the casing, the conductor assembly includes several conductors, and at least one conductor in the conductor assembly is connected to a power supply outside the casing and powers the signal boost circuit.

With reference to the implementation manner of the third aspect, in a first possible implementation manner, the conductor assembly includes four conductors, where one conductor powers the signal boost circuit, one conductor is connected to ground, two conductors transmit differential signals, and the signal boost circuit boosts the differential signals.

Different from the prior art, the connector and the electronic device in the embodiments of the present invention arrange a signal boost circuit in a casing of the connector to perform signal amplification processing on a differential signal. In this way, the connector is capable of controlling signal attenuation effectively under a high data transmission speed without increasing the size of a circuit board, and is capable of controlling costs of manufacturing and development effectively.

BRIEF DESCRIPTION OF DRAWINGS

FIG. 9 is a schematic diagram of a cross section of a substrate after the substrate is cut through;

DESCRIPTION OF EMBODIMENTS

Figure 1:
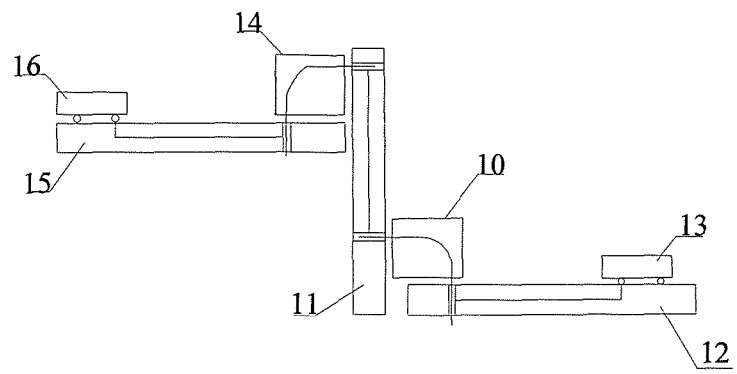
FIG. 1 is a schematic structural diagram of connections between a connector and a second circuit board as well as the circuit board in the prior art.

An embodiment of the present invention provides a connector, including: a first interface, a second interface, and a signal boost circuit, where at least one of the first interface and the second interface includes a power supply contact head, and the power supply contact head contacts an external power supply to power the signal boost circuit; and a casing, where the signal boost circuit is arranged inside the casing and concatenated between the first interface and the second interface, and the signal boost circuit performs signal amplification processing on a differential signal received by the first interface and outputs the signal over the second interface, and the first interface and the second interface are arranged on different surfaces outside the casing.

Further, an embodiment of the present invention provides an electronic device, including a first circuit board, a second circuit board, and a connector. The connector includes: a first interface, a second interface, and a signal boost circuit, where at least one of the first interface and the second interface includes a power supply contact head, and the power supply contact head is configured to power the signal boost circuit; and a casing, where the signal boost circuit is arranged inside the casing and concatenated between the first interface and the second interface, the signal boost circuit performs signal amplification processing on a differential signal received by the first interface and outputs the signal over the second interface, the first interface and the second interface are arranged on different surfaces outside the casing, a power output terminal is arranged on at least one of the first circuit board and the second circuit board, and the power supply contact head is connected to the power output terminal to acquire a power supply from the power output terminal to power the signal boost circuit.

Further, an embodiment of the present invention provides a connector, including at least one conductor assembly, a casing, and a signal boost circuit, where the signal boost circuit is arranged inside the casing, the conductor assembly includes several conductors, and at least one conductor in the conductor assembly is connected to a power supply outside the casing and powers the signal boost circuit.

In the manner described above, the connector and the electronic device in the embodiments of the present invention arrange a signal boost circuit in a casing of the connector, and are powered by a power supply outside the casing; and the signal boost circuit performs signal amplification processing on a differential signal. In this way, the connector is capable of controlling signal attenuation effectively under a high data transmission speed without increasing the size of the circuit board. In addition, by avoiding use of M6 board materials and high-speed cables, the present invention controls costs of manufacturing and development effectively.

The following describes the connector and the electronic device in the embodiments of the present invention with reference to specific embodiments.

Figure 3:
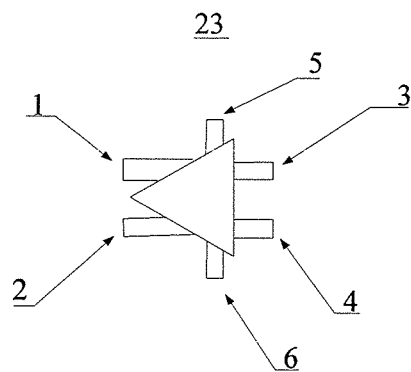
FIG. 3 is a schematic structural diagram of a signal boost circuit in a connector according to a first embodiment of the present invention.

Referring to FIG. 3, FIG. 3 is a schematic structural diagram of a signal boost circuit in a connector according to a first embodiment of the present invention. The signal boost circuit 23 is configured to amplify a voltage of a signal to achieve a signal boost effect. It includes a first input terminal 1, a second input terminal 2, a first output terminal 3, a second output terminal 4, a ground terminal 6, and a power input terminal 5. An external power supply is input into the power input terminal 5 to power the signal boost circuit 23. After the power supply is obtained, a data signal (in the present invention, a differential signal) input into the first input terminal 1 is output from the first output terminal 3 after experiencing signal amplification processing performed by the signal boost circuit 23, and a data signal (in the present invention, another differential signal) input into the second input terminal 2 is output from the second output terminal 4 after experiencing signal amplification processing performed by the signal boost circuit 23. It should be noted that the signal boost circuit 23 in the present invention applies the same amplification scale of the voltage amplitude to the two differential signals to ensure that the two differential signals have equal amplitudes and keep inverse phases.

The signal boost circuit 23 may be implemented as any circuit capable of amplifying a voltage amplitude or a balancer applied widely in the prior art. Usually, the balancer has been encapsulated as a chip. When the connector in the present invention is being manufactured, it is only required that a pin of the balancer is correspondingly welded to a line that requires signal relaying, which simplifies the manufacturing procedure. Therefore, the present invention preferably uses a balancer as the signal boost circuit.

Figure 4:
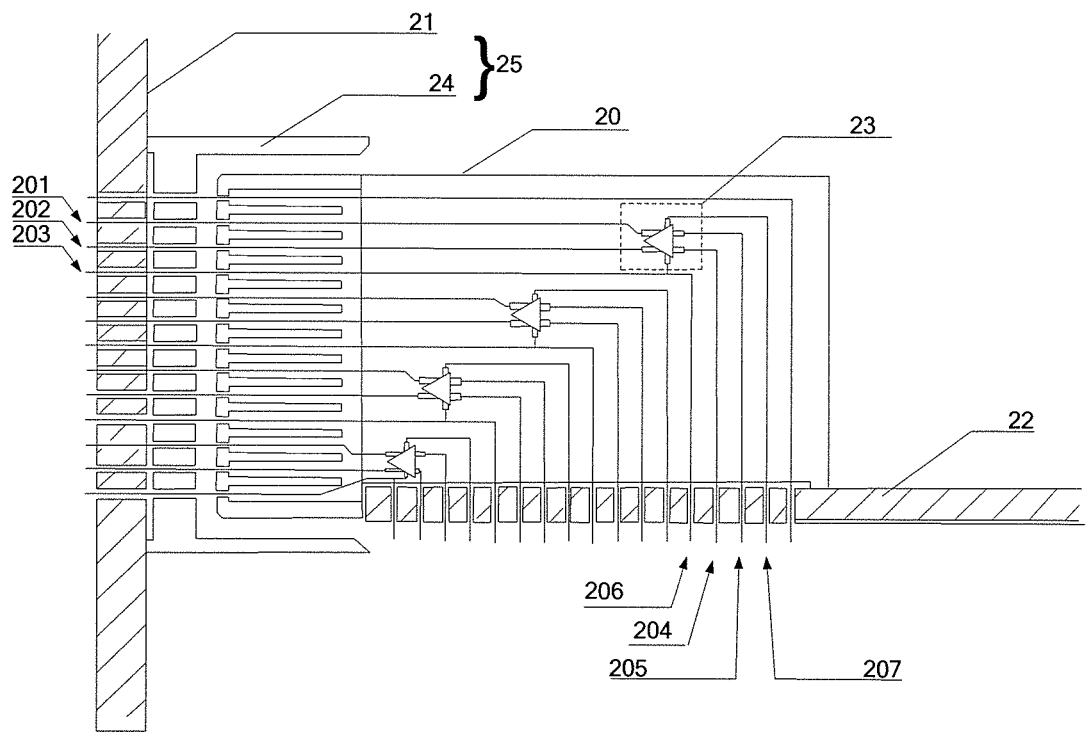
FIG. 4 is a detailed circuit diagram of connections between a connector and a second circuit board as well as the circuit board according to the first embodiment of the present invention.

Referring to FIG. 4, FIG. 4 is a schematic structural diagram of a circuit of an electronic device according to the first embodiment of the present invention. As illustrated in FIG. 4, this embodiment discloses an electronic device, which includes a first circuit board 25, a second circuit board 22, and a connector 20.

The connector 30 includes a first interface (not illustrated), a second interface (not illustrated), a casing (not illustrated), and the signal boost circuit 23 illustrated in FIG. 3. The signal boost circuit 23 is arranged in the casing. The first interface includes a first conductive contact head 204, a second conductive contact head 205, a third conductive contact head 206, and a fourth conductive contact head 207. The second interface includes a fifth conductive contact head 201, a sixth conductive contact head 202, and a seventh conductive contact head 203. The signal boost circuit 23 is arranged inside the casing and concatenated between the first interface and the second interface. The first interface and the second interface are arranged on different surfaces outside the casing.

The first conductive contact head 204 and the second conductive contact head 205 are configured to receive a differential signal from outside of the casing (in this embodiment, the first circuit board 22). The third conductive contact head 206 is configured to receive a ground signal from outside of the casing (in this embodiment, the first circuit board 22). The fourth conductive contact head 207 serves as a power supply contact head to receive a power supply from outside of the casing (in this embodiment, the first circuit board 22). The first input terminal 1 of the signal boost circuit 23 is connected to the first conductive contact head 204, the second input terminal 2 is connected to the second conductive contact head 205, the ground terminal 6 is connected to the third conductive contact head 206, and the power input terminal 5 is connected to the fourth conductive contact head 207.

The fifth conductive contact head 201 of the second interface is connected to the first output terminal 3, the sixth conductive contact head 202 is connected to the second output terminal 4, the seventh conductive contact head 203 is connected to the ground terminal 6, and the fifth conductive contact head 201 and the sixth conductive contact head 202 output the differential signal experiencing signal amplification processing performed by the signal boost circuit 23.

Specifically, in this embodiment, the power supply is provided by the first circuit board 22. A power output terminal (not illustrated) is arranged on the first circuit board 22. The power output terminal is connected to the fourth conductive contact head 207 serving as a power supply contact head, and is configured to supply power to the power input terminal 5, so as to power the signal boost circuit 23.

In this embodiment, the second circuit board 25 is preferably a backplane, and includes a main body 21 and a third interface 24, where the third interface 24 is connected to the first interface in a pluggable manner. Its interface connection manner can be implemented by using various methods in the prior art and therefore is not detailed herein.

The signal boost circuit 23 is arranged in the connector 20, and the power supply required by the signal boost circuit 23 is provided by the power output terminal of the first circuit board 22. Therefore, the connector and the electronic device disclosed in this embodiment are capable of controlling signal attenuation effectively under a high data transmission speed without increasing the size of the circuit board 22. This controls costs of manufacturing and development effectively.

In the first embodiment, for ease of description, only one signal boost circuit 23 is taken as an example in the description. However, as illustrated in FIG. 4, the number of the signal boost circuits 23 may also be plural, the first interface may also include a contact head combination formed by a plurality of groups of the first conductive contact head 204, the second conductive contact head 205, the third conductive contact head 206, and the fourth conductive contact head 207, and the second interface may also include a contact head combination formed by a plurality of groups of the fifth conductive contact head 201, the sixth conductive contact head 202, and the seventh conductive contact head 203, thereby implementing relay transmission of a plurality of pairs of differential signals.

It should be noted that in an alternative embodiment of the present invention, a coupling capacitor may be arranged between the fifth conductive contact head 201 of the connector 20 described in the first embodiment and the first output terminal 1 of the signal boost circuit 23, and between the sixth conductive contact head 202 and the second output terminal 2 of the signal boost circuit 23, so as to perform direct current blocking for the differential signal experiencing signal amplification processing and filter out direct current interference in the differential signal. A specific capacitance value of the coupling capacitor may be selected according to actual requirements, and is not specifically limited in the present invention.

Figure 5:
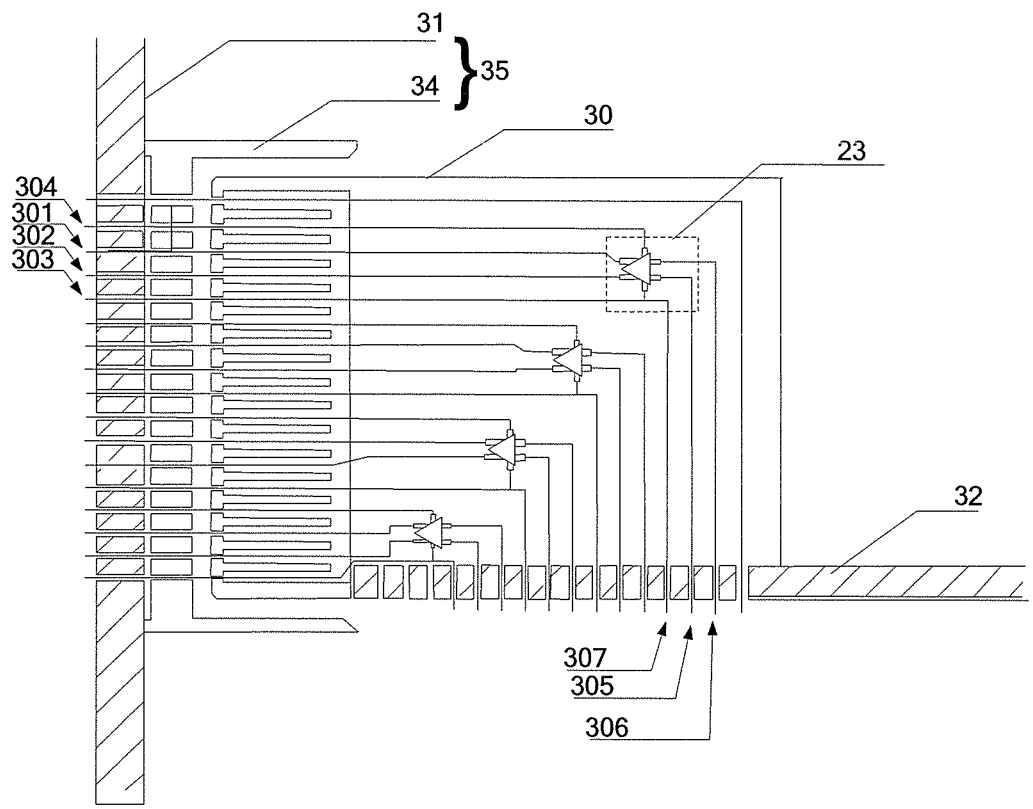
FIG. 5 is a detailed circuit diagram of connections between a connector and a second circuit board as well as the circuit board according to a second embodiment of the present invention.

Referring to FIG. 5, FIG. 5 is a schematic structural diagram of a circuit of an electronic device according to a second embodiment of the present invention. As illustrated in FIG. 5, this embodiment discloses an electronic device, which includes a first circuit board 35, a second circuit board 32, and a connector 30.

The connector 30 includes a first interface (not illustrated), a second interface (not illustrated), a casing (not illustrated), and the signal boost circuit 23 illustrated in FIG. 3. The signal boost circuit 23 is arranged in the casing. The first interface includes a first conductive contact head 305, a second conductive contact head 306, and a third conductive contact head 307. The second interface includes a fifth conductive contact head 301, a sixth conductive contact head 302, a seventh conductive contact head 303, and an eighth conductive contact head 304. The signal boost circuit 23 is arranged inside the casing and concatenated between the first interface and the second interface. The first interface and the second interface are arranged on different surfaces outside the casing.

The first conductive contact head 305 and the second conductive contact head 306 are configured to receive a differential signal from outside of the casing (in this embodiment, the first circuit board 32). The third conductive contact head 307 is configured to receive a ground signal from outside of the casing (in this embodiment, the first circuit board 32). The first input terminal 1 is connected to the first conductive contact head 305, the second input terminal 2 is connected to the second conductive contact head 306, the ground terminal 6 is connected to the third conductive contact head 307, and the signal boost circuit acquires the differential signal over the first input terminal 1 and the second input terminal 2, and performs signal amplification processing. The fifth conductive contact head 301 is connected to the first output terminal 3. The sixth conductive contact head 302 is connected to the second output terminal 4. The seventh conductive contact head 303 is connected to the ground terminal 6. The fifth conductive contact head 301 and the sixth conductive contact head 302 output the differential signal experiencing signal amplification processing performed by the signal boost circuit 23. The eighth conductive contact head 304 is connected to the power input terminal 5 as a power supply contact head, and is configured to receive a power supply from outside of the casing (in this embodiment, the second circuit board 35).

Specifically, in this embodiment, the differential signal is provided by the first circuit board 32, and the power supply is provided by the second circuit board 35. A power output terminal (not illustrated) is arranged on the second circuit board 35. The power output terminal is connected to the fourth conductive contact head 304 serving as a power supply contact head, and is configured to supply power to the power input terminal 5, so as to power the signal boost circuit 23.

In this embodiment, the second circuit board 35 is preferably a backplane, and includes a main body 31 and a third interface 34. The third interface 34 is connected to the first interface in a pluggable manner. Its interface connection manner can be implemented by using various methods in the prior art and therefore is not detailed herein.

The signal boost circuit 23 is arranged in the connector 30, and the power supply required by the signal boost circuit 23 is provided by the power output terminal of the second circuit board 35. Therefore, the connector and the electronic device disclosed in this embodiment are capable of controlling signal attenuation effectively under a high data transmission speed without increasing the size of the circuit board. This controls costs of manufacturing and development effectively.

It should be noted that in an alternative embodiment of the present invention, a coupling capacitor may be arranged between the fifth conductive contact head 301 of the connector 30 described in the second embodiment and the first output terminal 1 of the signal boost circuit 23, and between the sixth conductive contact head 302 and the second output terminal 2 of the signal boost circuit 23, so as to perform direct current blocking for the differential signal experiencing signal amplification processing and filter out direct current interference in the differential signal. A specific capacitance value of the coupling capacitor may be selected according to actual requirements, and is not specifically limited in the present invention.

In the second embodiment, for ease of description, only one signal boost circuit 23 is taken as an example in the description. However, as illustrated in FIG. 5, the number of the signal boost circuits 23 may also be plural, the first interface may also include a contact head combination formed by a plurality of groups of the first conductive contact head 305, the second conductive contact head 306, the third conductive contact head 307. The second interface may also include a contact head combination formed by a plurality of groups of the fifth conductive contact head 301, the sixth conductive contact head 302, the seventh conductive contact head 303, and the eighth conductive contact head 304, thereby implementing relay transmission of a plurality of differential signals.

In addition, in all embodiments of the present invention, a voltage value of the power supply is preferably 1.8 V or 3.3 V, and the selection of the voltage value depends on the type or model of the signal boost circuit in use.

Figure 6:
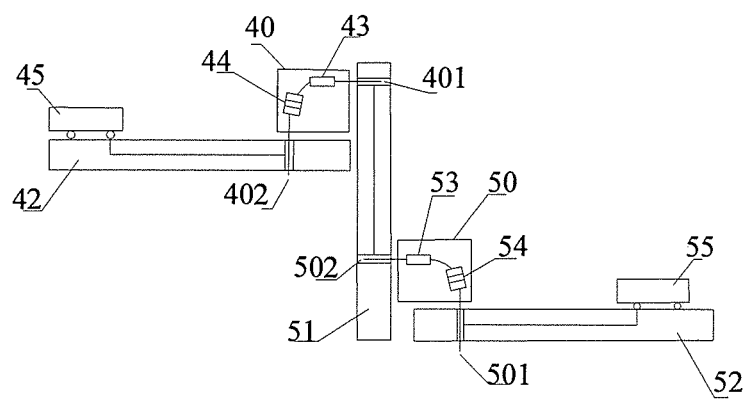
FIG. 6 is a schematic location diagram of a connector in a high-speed link according to a third embodiment of the present invention.

Referring to FIG. 6, FIG. 6 is a schematic location diagram of a connector in a high-speed link according to a third embodiment of the present invention. As illustrated in FIG. 6, components forming a high-speed second circuit board link include a second circuit board 51, a circuit board 42, a circuit board 42, a connector 50, and a connector 40. A signal boost circuit 43 and a coupling capacitor 44 are arranged in the connector 40, and a signal boost circuit 53 and a coupling capacitor 54 are arranged in the connector 50.

The first interface 501 of the connector 50 is inserted in the circuit board 52. The second interface 502 is inserted in the circuit board 51 to connect the second circuit board 51 and the circuit board 52. The first interface 401 of the connector 40 is inserted in the second circuit board 51. The second interface 402 is inserted in the circuit board 42 to connect the second circuit board 51 and the circuit board 42. A chip 55 is arranged on the circuit board 52, a chip 435 is arranged on the circuit board 42, and internal circuit connection wires (not illustrated) are arranged inside the backplane 11, the circuit board 12, and the circuit board 15. After the connector 50 is connected to the second circuit board 51 and the circuit board 52 and the connector 40 is connected to the second circuit board 51 and the circuit board 42, an electrical connection is implemented between the chip 55 and the chip 435.

It should be noted that the connector applied here is the connector described in the foregoing embodiment. For ease of description and for clarity of illustration, the specific conductive contact heads included in the first interface 401, the second interface 402, the first interface 501, and the first interface 502 are not illustrated. The conductive contact heads of the interfaces are the same as those described in the foregoing embodiment, and are not repeated here any further.

Because a signal boost circuit 53 is arranged in the connector 50 and a signal boost circuit 43 is arranged in the connector 40, differential signals transmitted between the chip 55 and the chip 435 may experience signal amplification processing performed by the signal boost circuit 53 and the signal boost circuit 43, thereby implementing relay amplification and controlling power loss of a differential signal transmitted at a high speed.

Figure 7:
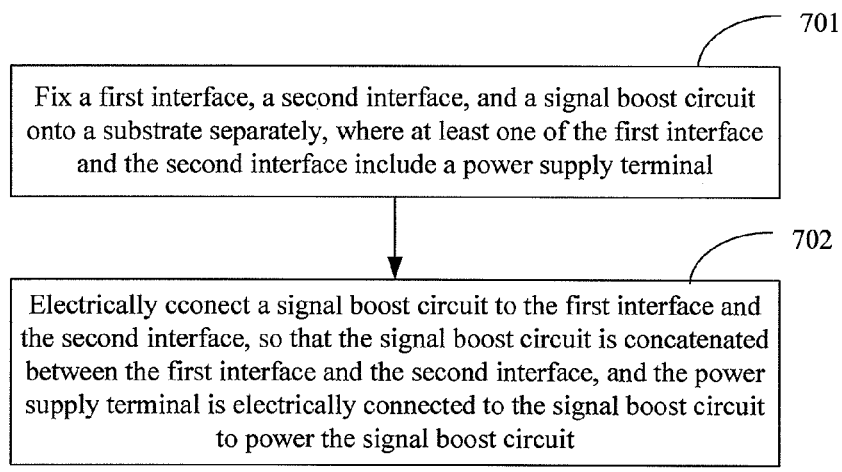
FIG. 7 is a flowchart of a connector manufacturing method according to a fourth embodiment of the present invention.

Referring to FIG. 7, FIG. 7 is a flowchart of a connector manufacturing method according to a fourth embodiment of the present invention. As illustrated in FIG. 7, the connector manufacturing method of the present invention includes the following steps:

Step 701: Fix a first interface, a second interface, and a signal boost circuit onto a substrate separately, where at least one of the first interface and the second interface includes a power supply contact head.

Step 702: Electrically connect the signal boost circuit to the first interface and the second interface, so that the signal boost circuit is concatenated between the first interface and the second interface, and the power supply contact head is electrically connected to the signal boost circuit to power the signal boost circuit.

In an alternative embodiment of the present invention, the step of electrically connecting the signal boost circuit to the first interface and the second interface is specifically: performing reflow soldering to weld a first input terminal, a second input terminal, a ground terminal, and a power input terminal of the packaged signal boost circuit onto a first conductive contact head, a second conductive contact head, a third conductive contact head, and a fourth conductive contact head of the first interface respectively, so as to create electrical connections on a one-to-one basis; and performing reflow soldering to weld a first output terminal, a second output terminal, and the ground terminal of the packaged signal boost circuit onto a fifth conductive contact head, a sixth conductive contact head, and a seventh conductive contact head of the second interface respectively, so as to create electrical connections on a one-to-one basis, thereby forming the connector described in the first embodiment of the present invention.

In another alternative embodiment of the present invention, the step of connecting the signal boost circuit to the first interface and the second interface electrically is specifically: performing reflow soldering to weld a first input terminal, a second input terminal, and a ground terminal of the packaged signal boost circuit onto a first conductive contact head, a second conductive contact head, and a third conductive contact head of the first interface respectively, so as to create electrical connections on a one-to-one basis; and performing reflow soldering to weld a first output terminal, a second output terminal, the ground terminal, and a power input terminal of the packaged signal boost circuit onto a fifth conductive contact head, a sixth conductive contact head, a seventh conductive contact head, and an eighth conductive contact head of the second interface respectively, so as to create electrical connections on a one-to-one basis, thereby forming the connector described in the second embodiment of the present invention.

Figure 8:
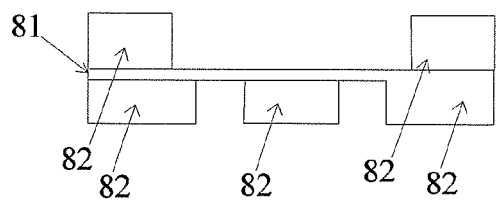
FIG. 8 is a schematic diagram of a cross section of a substrate.
Figure 9:
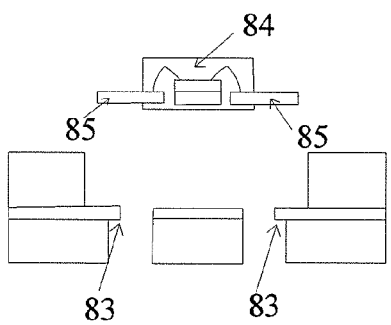
Figure 10:
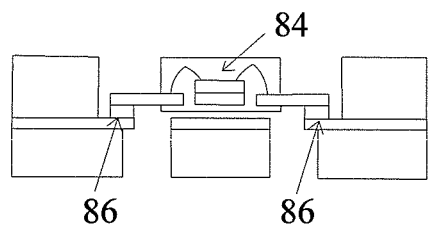
FIG. 10 is a schematic diagram of a cross section of a substrate after solder paste and a signal boost circuit are placed at a fracture of the substrate.

Specifically, FIG. 8 to FIG. 10 are schematic diagrams of an actual application process of the connector manufacturing method according to the present invention.

Figure 2:
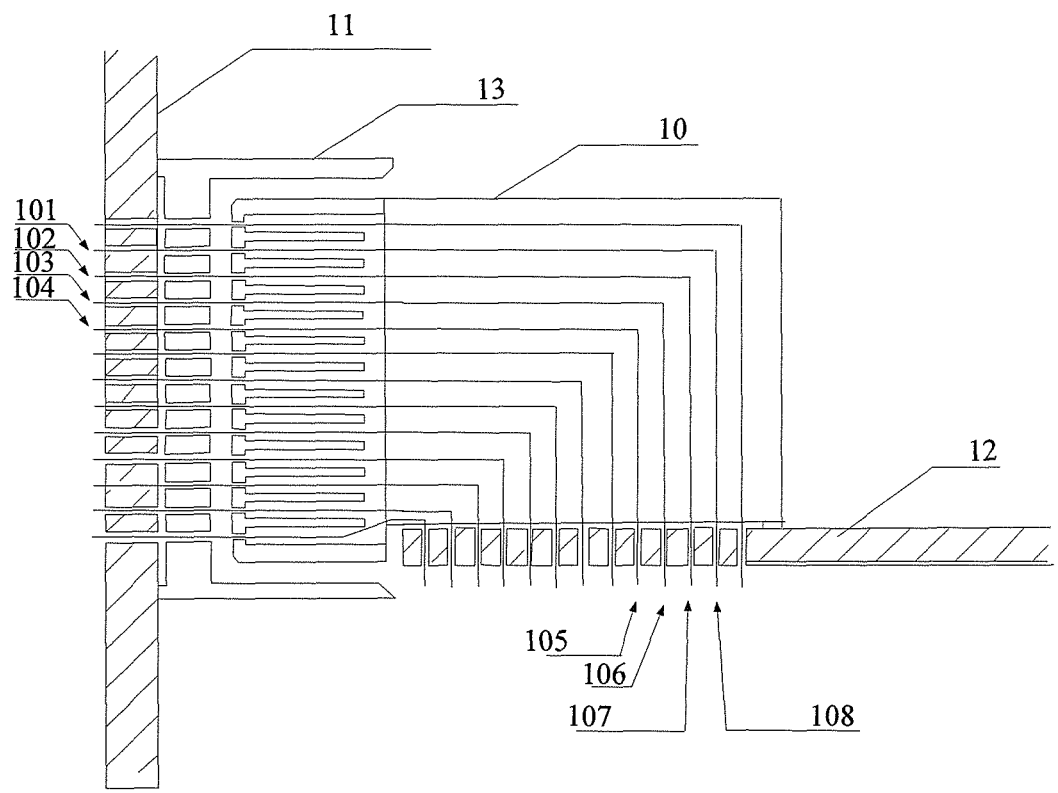
FIG. 2 is a detailed circuit diagram of connections between a connector and a second circuit board as well as the circuit board in the prior art.

FIG. 8 is a cross-sectional view of the substrate (the existing connector illustrated in FIG. 2). The substrate includes a plastic portion 82 and a cabling portion 81.

As illustrated in FIG. 9, a relay-required line is selected on the cabling portion 81, and the line is cut to form a fracture 83; and a packaged signal boost circuit 84 is prepared, which includes a pin 85.

As illustrated in FIG. 10, solder paste 86 is placed at the fracture 83 of the line, and the pin 85 of the packaged signal boost circuit 84 is placed onto the solder paste 86.

Figure 11:
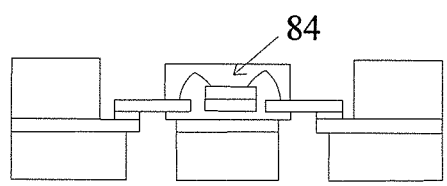
FIG. 11 is a schematic diagram of a cross section of a connector according to the present invention.

As illustrated in FIG. 11, by using the solder paste 86, reflow soldering is performed to fix the signal boost circuit 84 onto the substrate to form the connector disclosed in the present invention. The specific selection of the line is not repeated here any further, and reference may be made to the embodiment illustrated in FIG. 7 and the alternative embodiments thereof.

Figure 12:
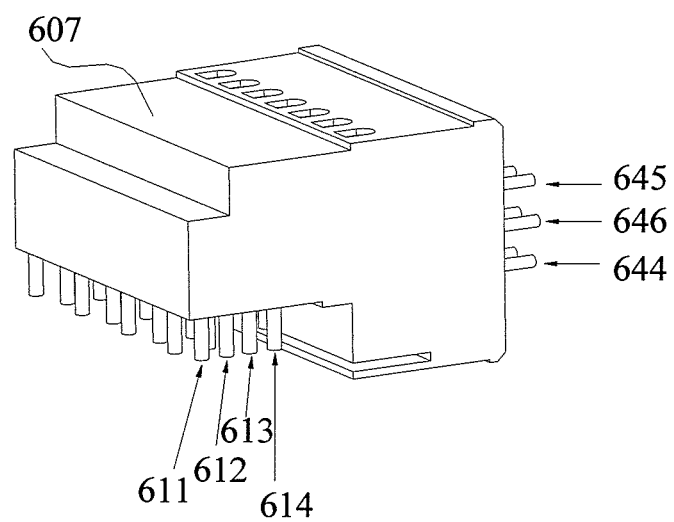
FIG. 12 is a three-dimensional schematic structural diagram of a connector according to a fifth embodiment of the present invention.

Referring to FIG. 12, FIG. 12 is a three-dimensional schematic structural diagram of a connector according to a fifth embodiment of the present invention. As illustrated in FIG. 12, in this embodiment, a connector 608 includes a casing 607 and a plurality of contact heads 611, 612, 613, 614, 644, 645, and 646 that are arranged outside the casing 607, where the contact heads 611, 612, 613, and 614 are arranged on a surface of the casing 607, and the contact heads 644, 645, and 646 are arranged on another surface of the casing 607.

Figure 13:
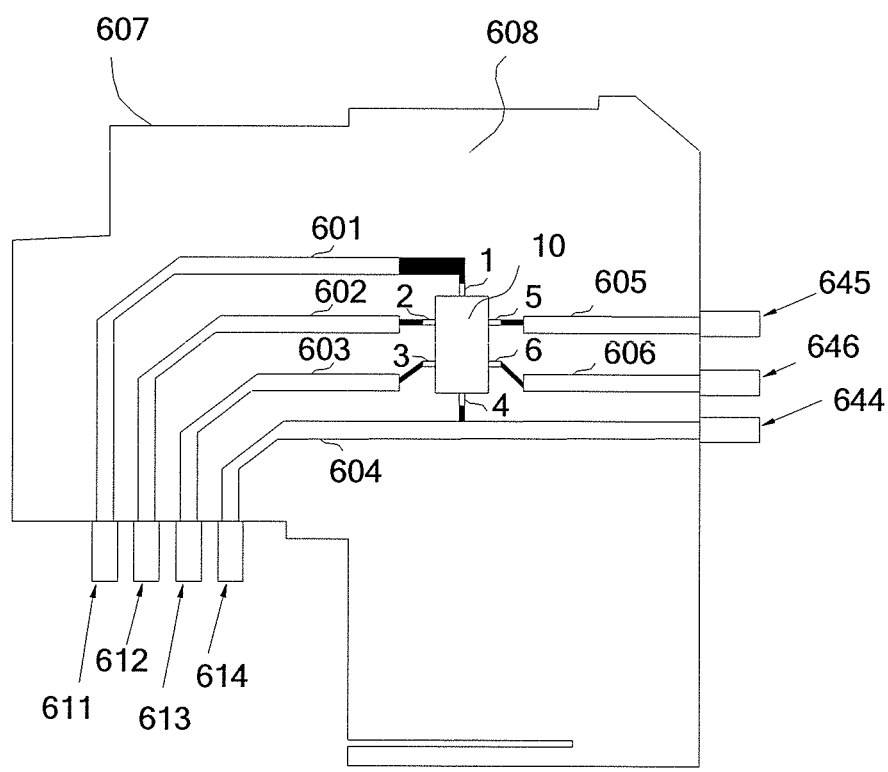
FIG. 13 is a cross-sectional view of the connector according to the fifth embodiment of the present invention.

Referring to FIG. 13, FIG. 13 is a cross-sectional view of the connector according to the fifth embodiment of the present invention. As illustrated in FIG. 13, a signal boost circuit 10 and a conductor assembly are further arranged inside the connector.

The conductor assembly includes a first conductor 601, a second conductor 602, a third conductor 603, a fourth conductor 604, a fifth conductor 605, and a sixth conductor 606. The first conductor 601 is connected to a power supply outside the casing 607 and powers the signal boost circuit 10.

The signal boost circuit 10 has a power input terminal 1, a first signal input terminal 2, a second signal input terminal 3, a ground terminal 4, a first signal output terminal 5, and a second signal output terminal 6 arranged.

One end of the first conductor 601 is connected to the power input terminal 1, and inputs a power supply from outside of the casing 607 into the signal boost circuit 10 to power the signal boost circuit 10. One end of the second conductor 602 is connected to the first signal input terminal 2, one end of the third conductor 603 is connected to the second signal input terminal 3, and the second conductor 602 and the third conductor 603 input a differential signal from outside of the casing 607 into the signal boost circuit 10. The signal boost circuit 10 performs signal amplification processing on the differential signal, and outputs it to one end of the fifth conductor 605 and one end of the sixth conductor 606. The ground terminal 4 is connected between one end of the fourth conductor 604 and the other end of the fourth conductor 604.

The other end of the first conductor 601, the other end of the second conductor 602, the other end of the third conductor 603, and the other end of the fourth conductor 604 are respectively connected to a plurality of conductive contact heads 611, 612, 613, and 614 that are arranged on one surface of the casing 607. The other end of the fifth conductor 605, the other end of the sixth conductor 606, and the other end of the fourth conductor 604 are respectively connected to a plurality of conductive contact heads 645, 646, and 644 that are arranged on another surface of the casing.

The first conductor 601, the second conductor 602, the third conductor 603, and the fourth conductor 604 are curved conductors, and the fifth conductor 605 and the sixth conductor 606 are straight conductors. It should be noted that in this embodiment, the foregoing settings are made to meet the requirement of a vertical angle between external circuit boards (which will be detailed later) connected to the connector 608, but in an alternative embodiment of the present invention, the shapes of the conductors may be set according to actual needs, and are not specifically limited in the present invention.

Moreover, the first conductor 601, the second conductor 602, the third conductor 603, the fourth conductor 604, the fifth conductor 605, and the sixth conductor 606 are connected to the power input terminal 1, the first signal input terminal 2, the second signal input terminal 3, the ground terminal 4, the first signal output terminal 5, and the second signal output terminal 6 by using solder paste (illustrated by the black part in the drawing) to fix and keep the electrical connections.

It should be noted that in an alternative embodiment of the present invention, a coupling capacitor may be arranged on the fifth conductor 605 and the sixth conductor 606 each, so as to perform direct-current blocking for the differential signal experiencing signal amplification processing.

Figure 14:
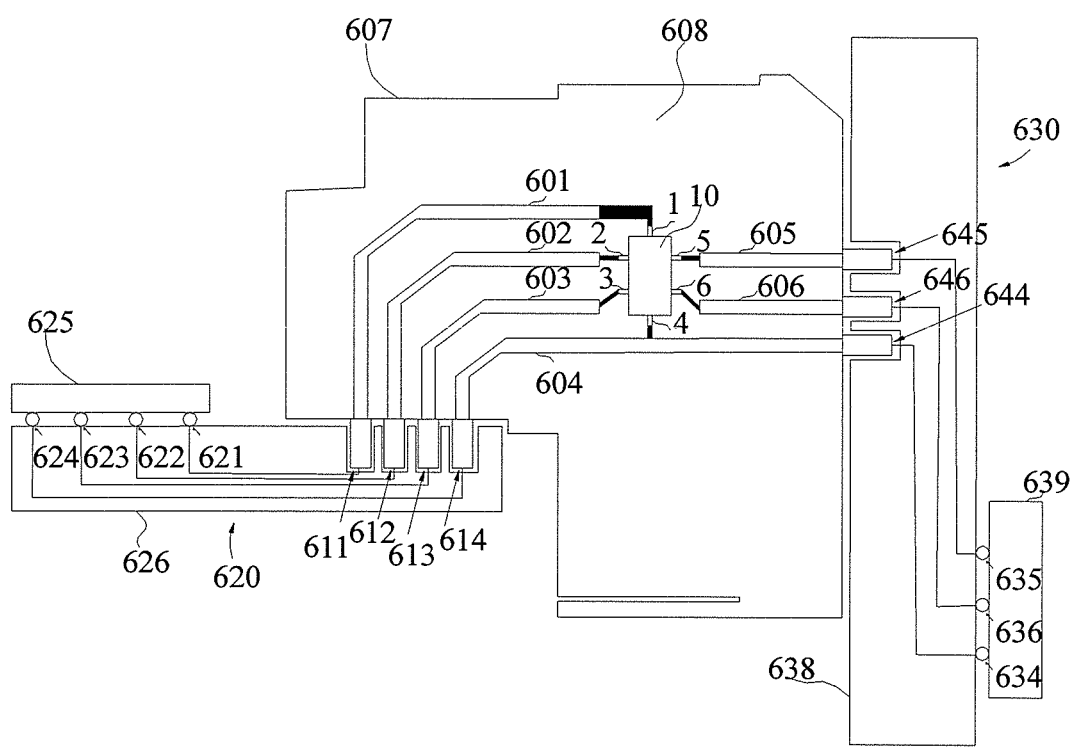
FIG. 14 is a schematic diagram of a system structure of an electronic device according to the fifth embodiment of the present invention.

Referring to FIG. 14, FIG. 14 is a schematic diagram of a system structure of an electronic device according to the fifth embodiment of the present invention. As illustrated in FIG. 14, this embodiment further discloses an electronic device, which includes a first circuit board 620, a second circuit board 630, and the connector 608 illustrated in FIG. 13.

The first circuit board 620 includes a main board body 626 and a component 625, where a power output terminal 621, differential signal output terminals 622 and 623, and a ground terminal 624 are arranged on the component 625.

The second circuit board 630 includes a main board body 638 and a component 639, where differential signal input terminals 635 and 636 and a ground terminal 634 are arranged on the component 639.

The first circuit board 620 has interfaces (not illustrated) arranged for inserting contact heads 611, 612, 613, and 614, and the second circuit board 630 has interfaces (not illustrated) arranged for inserting contact heads 645, 646, and 644.

When the contact heads 611, 612, 613, and 614 are inserted into the interfaces on the first circuit board 620 and the contact heads 611, 612, 613, and 614 are inserted into the interfaces on the second circuit board 630, the power output terminal 621, the differential signal output terminals 622 and 623, and the ground terminal 624 are respectively connected to the power input terminal 1, the first signal input terminal 2, the second signal input terminal 3, and the ground terminal 4 by using the conductors (not illustrated) in the main board body 626, the first conductor 601, the second conductor 602, the third conductor 603, and the fourth conductor 604; the first signal output terminal 5, the second signal output terminal 6, and the ground terminal 4 are respectively connected to the differential signal input terminals 635 and 636 and the ground terminal 634 by using the fifth conductor 605, the sixth conductor 606, the fourth conductor 604, and the conductors (not illustrated) in the main board body 638.

The power output terminal 621 outputs a power supply to the signal boost circuit 10 to keep it working. The differential signal output terminals 622 and 623 output a differential signal to the signal boost circuit 10 for relay amplification, and the signal boost circuit 10 outputs the differential signal experiencing relay amplification to the differential signal input terminals 635 and 636. Moreover, the ground terminal 624 of the component 625, the ground 4 of the signal boost circuit 10, and the ground terminal 634 of the component 639 keep connected, thereby ensuring the three to share the ground.

Therefore, by using the power supply provided by the first circuit board 620, the connector 608 is capable of performing relay amplification on a differential signal transmitted by the first circuit board 620 to the second circuit board 630, thereby suppressing signal attenuation effectively.

In addition, because the first conductor 601 is connected to the fifth conductor 605 by using the signal boost circuit 10, the first conductor 601 and the fifth conductor 605 may be combined into one conductor.

Similarly, because the second conductor 602 is connected to the sixth conductor 606 by using the signal boost circuit 10, the second conductor 602 and the sixth conductor 606 may be combined into one conductor.

Therefore, in this embodiment, the conductor assembly includes four conductors, where the first conductor powers the signal boost circuit, the fourth conductor 604 is grounded, the conductor formed by the first conductor 601 and the fifth conductor 605 as well as the conductor formed by the second conductor 602 and the sixth conductor 606 are configured to transmit differential signals, and then the differential signals are boosted by the signal boost circuit 10.

In an extended embodiment of the present invention, a plurality of conductor assemblies may be set, and a signal boost circuit is arranged for each conductor assembly in the manner described above, so as to amplify a plurality of differential signals simultaneously.

Figure 15:
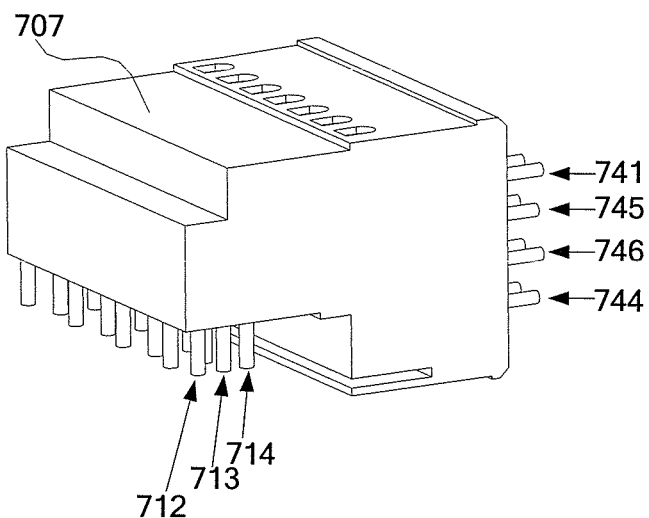
FIG. 15 is a three-dimensional schematic structural diagram of a connector according to a sixth embodiment of the present invention.

Referring to FIG. 15, FIG. 15 is a three-dimensional schematic structural diagram of a connector according to a sixth embodiment of the present invention. As illustrated in FIG. 15, in this embodiment, a connector 708 includes a casing 707 and a plurality of contact heads 712, 713, 714, 744, 745, and 746 that are arranged outside the casing 707. The contact heads 712, 713, 714, and 715 are arranged on a surface of the casing 707, and the contact heads 741, 744, 745, and 746 are arranged on another surface of the casing 707.

Figure 16:
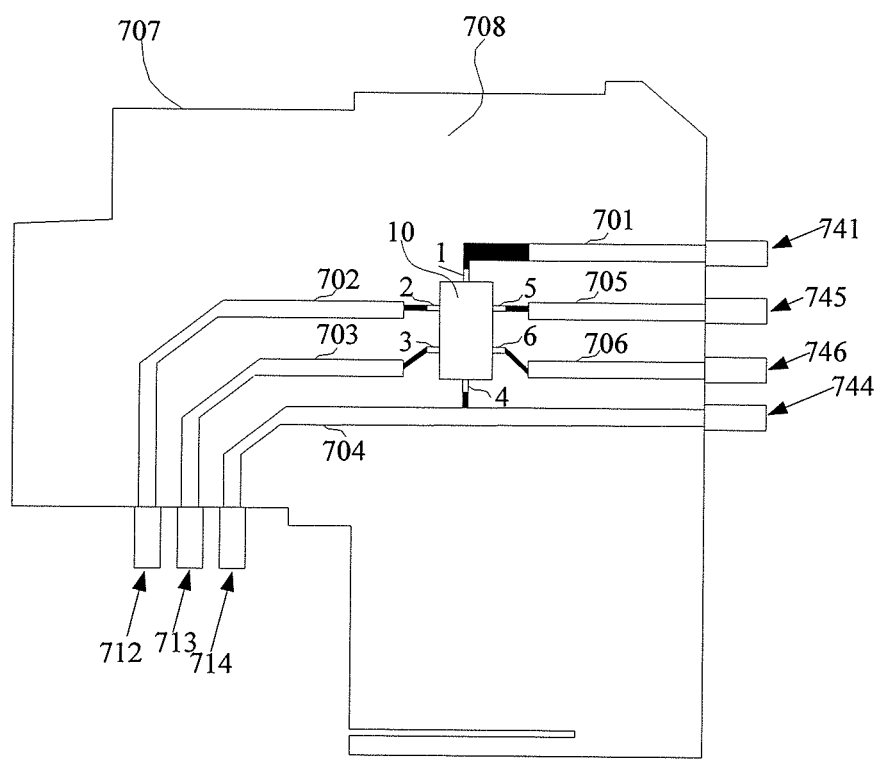
FIG. 16 is a cross-sectional view of the connector according to the sixth embodiment of the present invention.

Referring to FIG. 16, FIG. 16 is a cross-sectional view of the connector according to the sixth embodiment of the present invention. As illustrated in FIG. 13, a signal boost circuit 10 and a conductor assembly are further arranged inside the connector 708. The conductor assembly includes a first conductor 701, a second conductor 702, a third conductor 703, a fourth conductor 704, a fifth conductor 705, and a sixth conductor 706. The first conductor 701 is connected to a power supply outside the casing 707 and powers the signal boost circuit 10.

The signal boost circuit 10 has a power input terminal 1, a first signal input terminal 2, a second signal input terminal 3, a ground terminal 4, a first signal output terminal 5, and a second signal output terminal 6 arranged.

One end of the first conductor 701 is connected to the power input terminal 1, and inputs a power supply from outside of the casing 707 into the signal boost circuit 10 to power the signal boost circuit 10. One end of the second conductor 702 is connected to the first signal input terminal 2, one end of the third conductor 703 is connected to the second signal input terminal 3, and the second conductor 702 and the third conductor 703 input a differential signal from outside of the casing 707 into the signal boost circuit 10. The signal boost circuit 10 performs signal amplification processing on the differential signal, and outputs it to one end of the fifth conductor 705 and one end of the sixth conductor 706, and the ground terminal 4 is connected between one end of the fourth conductor 704 and the other end the fourth conductor 704.

The other end of the second conductor 702, the other end of the third conductor 703, and the other end of the fourth conductor 704 are respectively connected to a plurality of conductive contact heads 712, 713, and 714 that are arranged on one surface of the casing 707. The other end of the first conductor 701, the other end of the fifth conductor 705, the other end of the sixth conductor 706, and the other end of the fourth conductor 704 are respectively connected to a plurality of conductive contact heads 741, 745, 747, and 744 that are arranged on another surface of the casing.

The second conductor 702, the third conductor 703, and the fourth conductor 704 are curved conductors, and the first conductor 701, the fifth conductor 705, and the sixth conductor 706 are straight conductors. It should be noted that in this embodiment, the foregoing settings are made to meet the requirement of a vertical angle between external circuit boards (which will be detailed later) connected to the connector 708, but in an alternative embodiment of the present invention, the shapes of the conductors may be set according to actual needs, and are not specifically limited in the present invention.

Moreover, the first conductor 701, the second conductor 702, the third conductor 703, the fourth conductor 704, the fifth conductor 705, and the sixth conductor 706 are connected to the power input terminal 1, the first signal input terminal 2, the second signal input terminal 3, the ground terminal 4, the first signal output terminal 5, and the second signal output terminal 7 by using solder paste (illustrated by the black part in the drawing) to fix and keep the electrical connections.

It should be noted that in an alternative embodiment of the present invention, a coupling capacitor may be arranged on the fifth conductor 705 and the sixth conductor 706 each, so as to perform direct-current blocking for the differential signal experiencing signal amplification processing.

In addition, because the first conductor 701 is connected to the fifth conductor 705 by using the signal boost circuit 10, the first conductor 701 and the fifth conductor 705 may be combined into one conductor.

Similarly, because the second conductor 702 is connected to the sixth conductor 706 by using the signal boost circuit 10, the second conductor 702 and the sixth conductor 706 may be combined into one conductor.

Therefore, in this embodiment, the conductor assembly includes four conductors, where the first conductor powers the signal boost circuit, the fourth conductor 704 is grounded, the conductor formed by the first conductor 701 and the fifth conductor 705 as well as the conductor formed by the second conductor 702 and the sixth conductor 706 are configured to transmit differential signals, and then the differential signals are boosted by the signal boost circuit 10.

In addition, in an extended embodiment of the present invention, a plurality of conductor assemblies may be set, and a signal boost circuit is arranged for each conductor assembly in the manner described above, so as to amplify a plurality of differential signals simultaneously.

Figure 17:
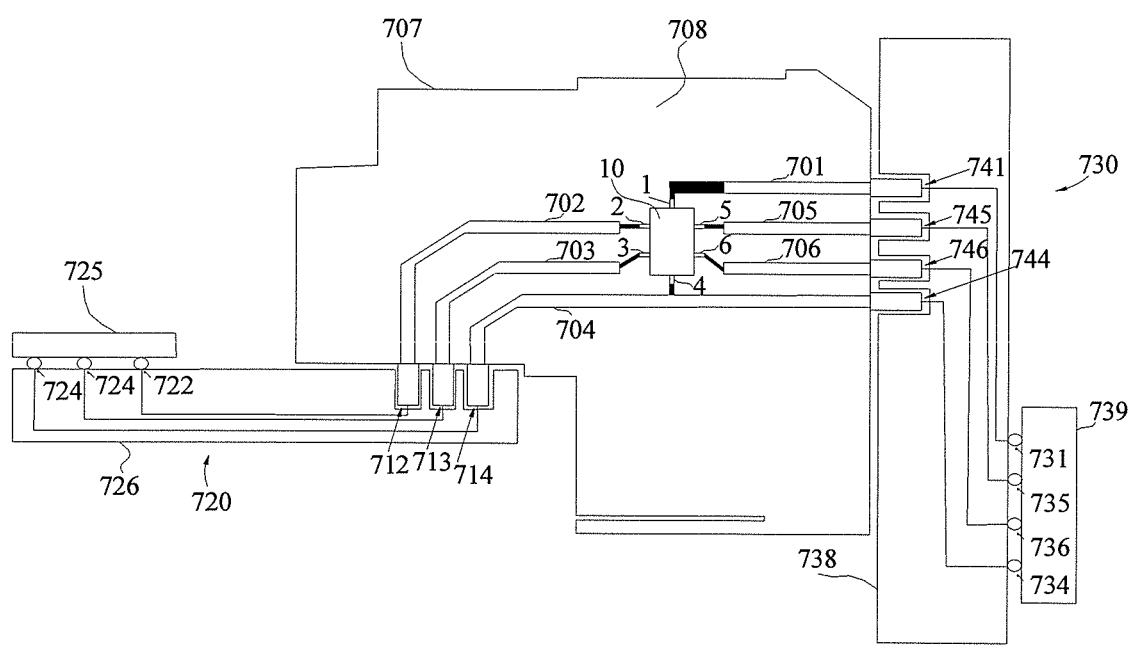
FIG. 17 is a schematic diagram of a system structure of an electronic device according to the six embodiment of the present invention.

Referring to FIG. 17, FIG. 17 is a schematic diagram of a system structure of an electronic device according to the sixth embodiment of the present invention. As illustrated in FIG. 17, this embodiment further discloses an electronic device, which includes a first circuit board 720, a second circuit board 730, and the connector 708 illustrated in FIG. 16.

The first circuit board 720 includes a main board body 726 and a component 725, where differential signal output terminals 722 and 723 and a ground terminal 724 are arranged on the component 725.

The second circuit board 730 includes a main board body 738 and a component 739, where a power output terminal 731, differential signal input terminals 735 and 736, and a ground terminal 734 are arranged on the component 739.

The first circuit board 720 has interfaces (not illustrated) arranged for inserting contact heads 712, 713, and 714, and the second circuit board 730 has interfaces (not illustrated) arranged for inserting contact heads 741, 745, 746, and 744.

When the contact heads 712, 713, and 714 are inserted into the interfaces on the first circuit board 720 and the contact heads 741, 745, 746, and 744 are inserted into the interfaces on the second circuit board 730, the differential signal output terminals 722 and 723 and the ground terminal 724 are respectively connected to the first signal input terminal 2, the second signal input terminal 3, and the ground terminal 4 by using the conductors (not illustrated) in the main board body 726, the second conductor 702, the third conductor 703, and the fourth conductor 704. The power input terminal 1, the first signal output terminal 5, the second signal output terminal 6, and the ground terminal 4 are respectively connected to the power output terminal 739, the differential signal input terminals 735 and 736, and the ground terminal 734 by using the first conductor 701, the fifth conductor 705, the sixth conductor 706, the fourth conductor 704, and the conductors (not illustrated) in the main board body 738.

The power output terminal 731 outputs a power supply to the signal boost circuit 10 to keep it working. The differential signal output terminals 722 and 723 output a differential signal to the signal boost circuit 10 for relay amplification, and the signal boost circuit 10 outputs the differential signal experiencing relay amplification to the differential signal input terminals 735 and 736. Moreover, the ground terminal 724 of the component 725, the ground 4 of the signal boost circuit 10, and the ground terminal 734 of the component 739 keep connected, thereby ensuring the three to share the ground.

Therefore, by using the power supply provided by the second circuit board 730, the connector 708 is capable of performing relay amplification on a differential signal transmitted by the first circuit board 720 to the second circuit board 730, thereby suppressing signal attenuation effectively.

Figure 18:
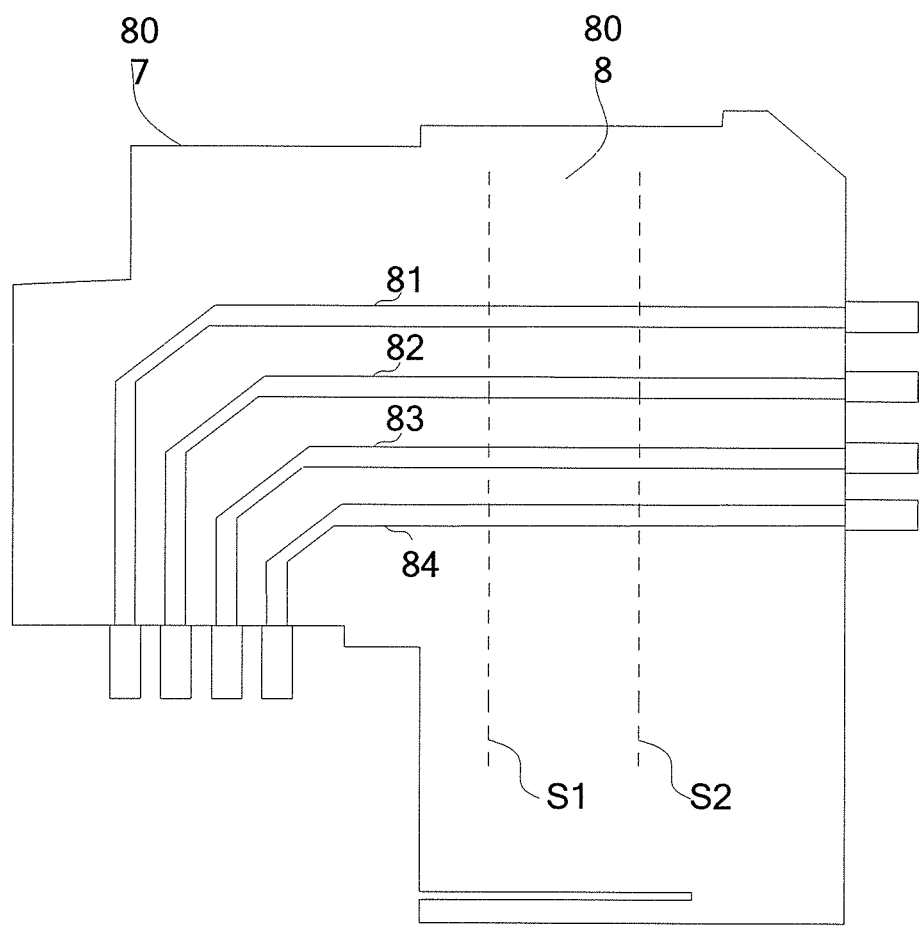
FIG. 18 is a cross-sectional view of a connector without a signal boost circuit arranged according to a seventh embodiment of the present invention.

The following expounds a connector manufacturing method according to a seventh embodiment of the present invention with reference to FIG. 18 to FIG. 24. Referring to FIG. 18 first, FIG. 18 is a cross-sectional view of a connector without a signal boost circuit arranged according to a seventh embodiment of the present invention. As illustrated in FIG. 18, a connector 809 includes a casing 807 and conductors 801, 802, 803, and 804.

Figure 19:
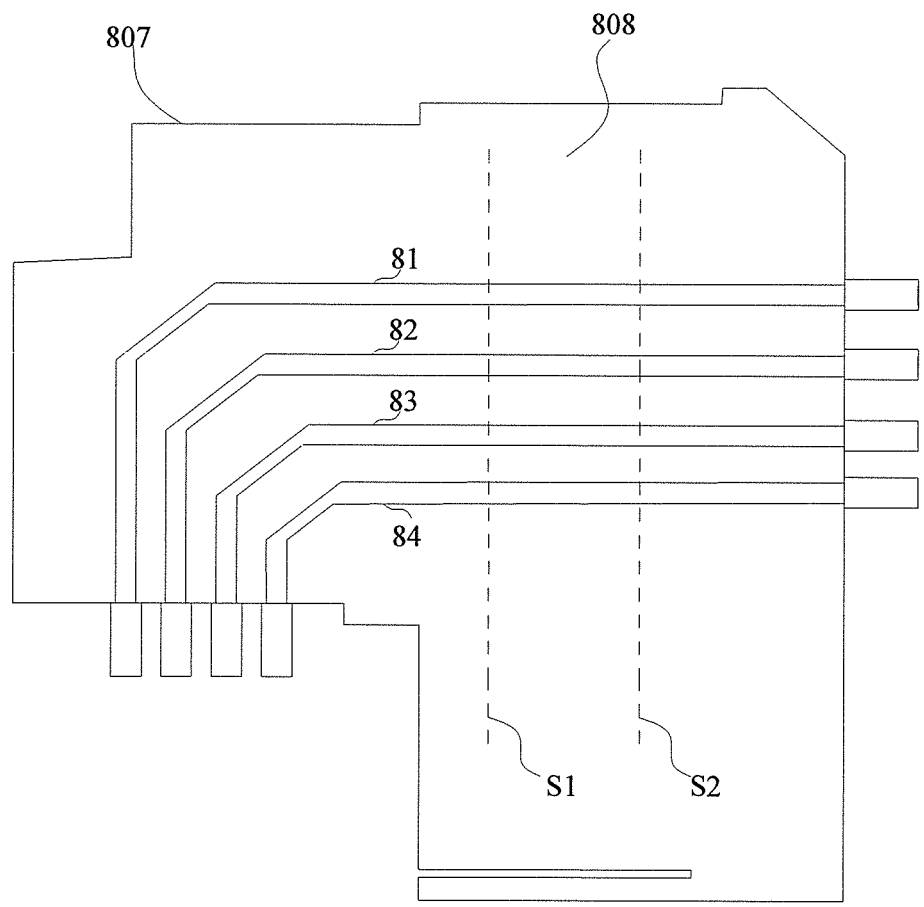
FIG. 19 is a schematic structural diagram of the connector illustrated in FIG. 18 when the connector is being cut according to the seventh embodiment of the present invention.

Referring to FIG. 19, FIG. 19 is a schematic structural diagram of the connector illustrated in FIG. 18 when the connector is being cut according to the seventh embodiment of the present invention. As illustrated in FIG. 19, the conductors 801, 802, 803, and 804 may be cut along the cutting lines S1 and S2 after the casing 807 is removed (if the casing 807 encloses the conductor incompletely, parts of the conductors exposed outside the casing 807 may be cut without removing the casing 807).

Figure 20:
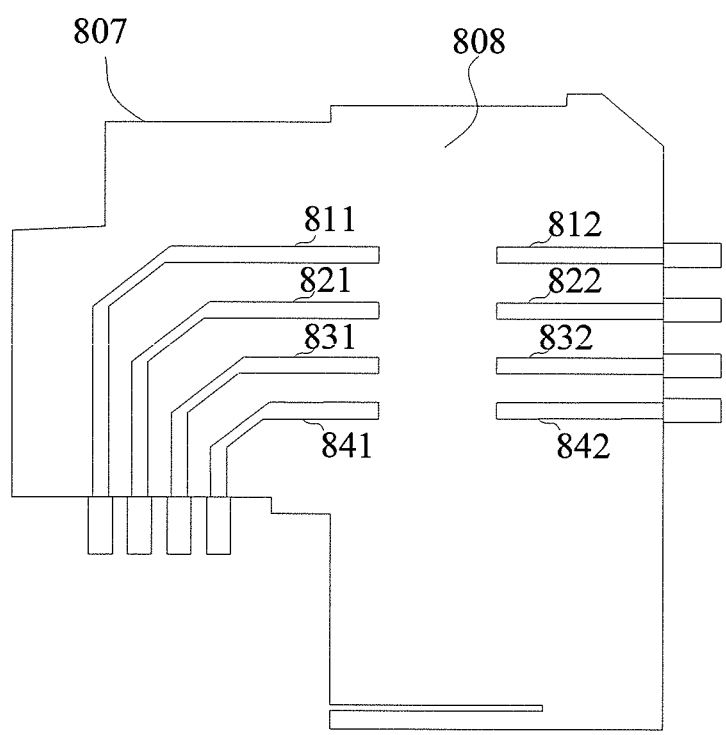
FIG. 20 is a schematic structural diagram of the connector illustrated in FIG. 18 after the connector is cut according to the seventh embodiment of the present invention.

Referring to FIG. 20, FIG. 20 is a schematic structural diagram of the connector illustrated in FIG. 18 after the connector is cut according to the seventh embodiment of the present invention. As illustrated in FIG. 20, after the cutting, cut connectors 811, 812, 821, 822, 831, 832, 841, and 842 are formed.

Figure 21:
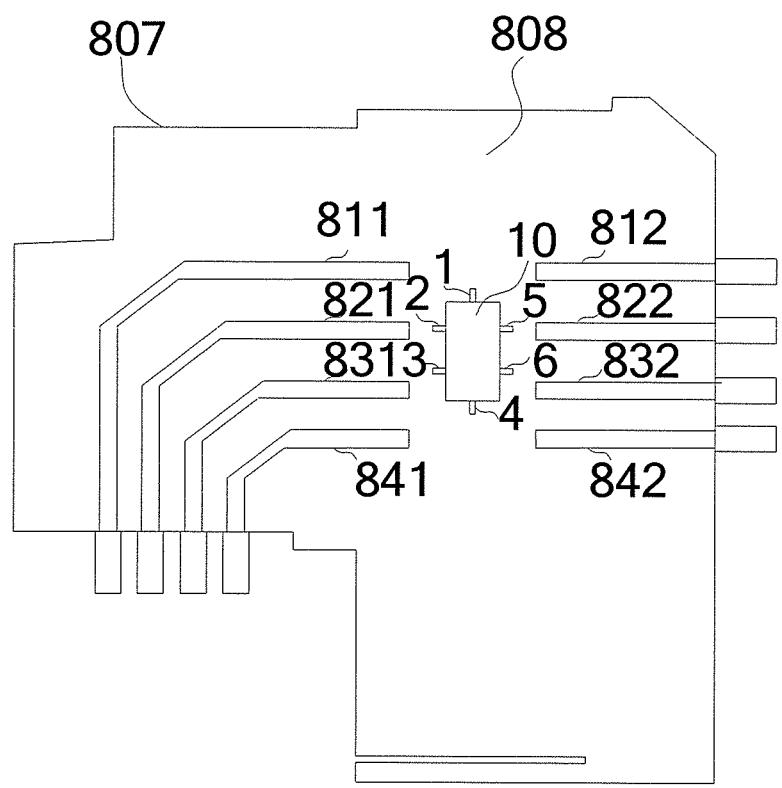
FIG. 21 shows a location for placing a signal boost circuit after connectors are cut according to the seventh embodiment of the present invention.

Referring to FIG. 21, FIG. 21 shows a location for placing a signal boost circuit after conductors are cut according to the seventh embodiment of the present invention. As illustrated in FIG. 21, the signal boost circuit 10 is placed between fractures. The signal boost circuit 10 has a power input terminal 1, a first signal input terminal 2, a second signal input terminal 3, a ground terminal 4, a first signal output terminal 5, and a second signal output terminal 6 arranged.

Figure 22:
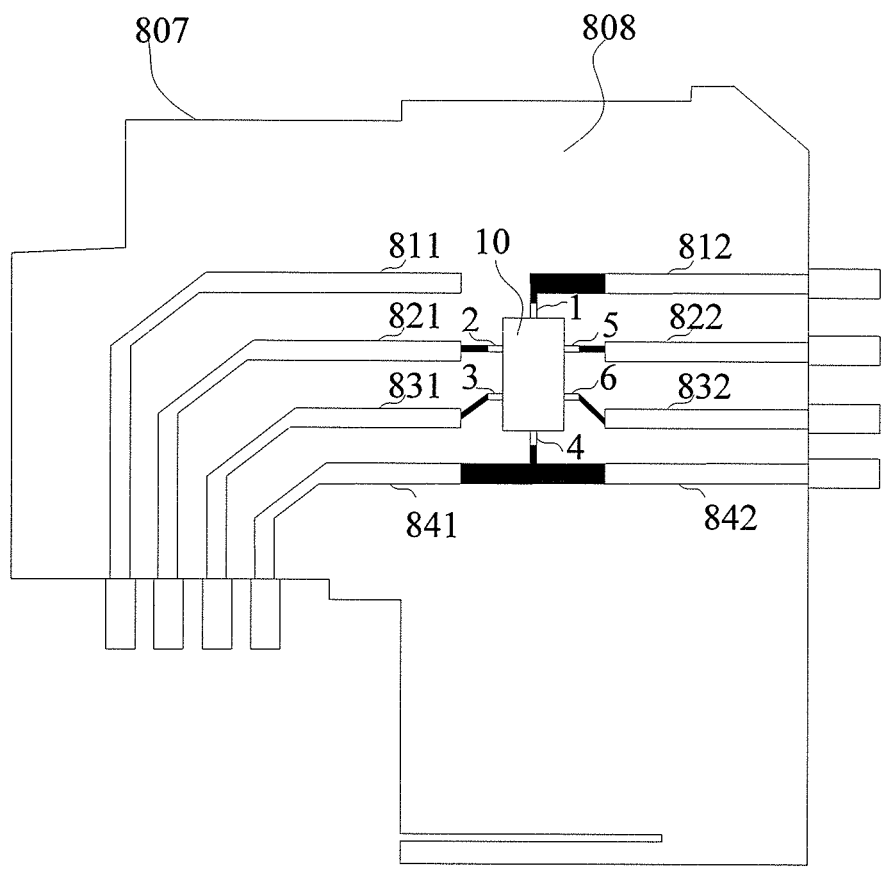
FIG. 22 is a schematic structural diagram of a connector obtained after a first welding manner is implemented according to the seventh embodiment of the present invention.

Referring to FIG. 22, FIG. 22 is a schematic structural diagram of a connector obtained after a first welding manner is implemented according to the seventh embodiment of the present invention. As illustrated in FIG. 22, the power input terminal 1 is welded to the conductor 812, the first signal input terminal 2 is welded to the conductor 821, the second signal input terminal 3 is welded to the conductor 831, the ground terminal 4 is welded to the conductor 841 and the conductor 842 separately, the first signal output terminal 5 is welded to the conductor 822, the second signal output terminal 6 is welded to the conductor 832, and the conductor 811 is deleted, so as to obtain the connector described in the sixth embodiment (the conductor 811 may also be retained and connected to another signal boost circuit).

Figure 23:
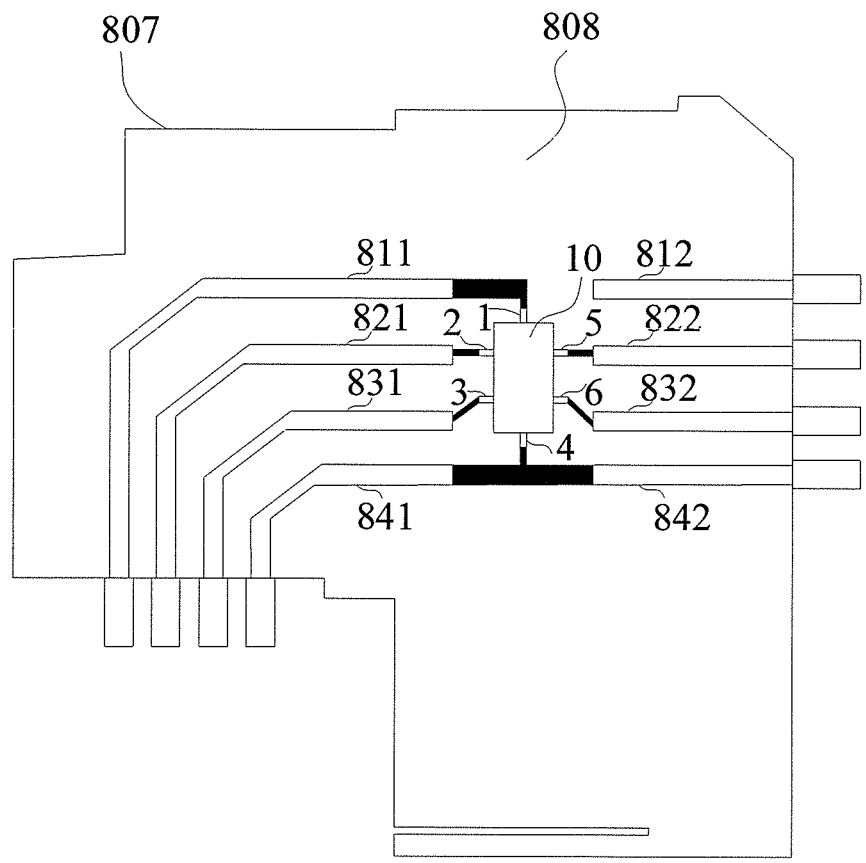
FIG. 23 is a schematic structural diagram of a connector obtained after another welding manner is implemented according to the seventh embodiment of the present invention.

Referring to FIG. 23, FIG. 23 is a schematic structural diagram of a connector obtained after another welding manner is implemented according to the seventh embodiment of the present invention. As illustrated in FIG. 23, the power input terminal 1 is welded to the conductor 811, the first signal input terminal 2 is welded to the conductor 821, the second signal input terminal 3 is welded to the conductor 831, the ground terminal 4 is welded to the conductor 841 and the conductor 842 separately, the first signal output terminal 5 is welded to the conductor 822, the second signal output terminal 6 is welded to the conductor 832, and the conductor 812 is deleted, so as to obtain the connector described in the six embodiment (the conductor 812 may also be retained and connected to another signal boost circuit).

Therefore, the present invention discloses a connector, a method for manufacturing the connector, and an electronic device, which can perform signal amplification processing on a differential signal. In this way, the connector is capable of controlling signal attenuation effectively under a high data transmission speed without increasing the size of a circuit board, and is capable of controlling costs of manufacturing and development effectively.

The foregoing descriptions are merely embodiments of the present invention, and the protection scope of the present invention is not limited thereto. All equivalent structural or process changes made according to the content of this specification and accompanying drawings in the present invention or by directly or indirectly applying the present invention in other relevant technical fields shall fall within the protection scope of the present invention.

What is claimed is:

1. A connector, comprising:
a first interface, a second interface, and a signal boost circuit, wherein at least one of the first interface and the second interface comprises a power supply contact head configured to connect to a power supply outside the connector to power the signal boost circuit; and
a casing, wherein the signal boost circuit is arranged inside the casing and concatenated between the first interface and the second interface, the signal boost circuit performs signal amplification processing on a differential signal received by the first interface and outputs the signal over the second interface, and the first interface and the second interface are arranged on different surfaces outside the casing.

2. A connector, comprising:
a first interface, a second interface, and a signal boost circuit, wherein at least one of the first interface and the second interface comprises a power supply contact head configured to connect to a power supply outside the connector to power the signal boost circuit;
a casing, wherein the signal boost circuit is arranged inside the casing and concatenated between the first interface and the second interface, the signal boost circuit performs signal amplification processing on a differential signal received by the first interface and outputs the signal over the second interface, and the first interface and the second interface are arranged on different surfaces outside the casing;
the first interface comprises a first conductive contact head, a second conductive contact head, a third conductive contact head, and a fourth conductive contact head, wherein the first conductive contact head and the second conductive contact head are configured to receive the differential signal from outside of the casing, the third conductive contact head is configured to receive a ground signal from outside of the casing, and the fourth conductive contact head serves as the power supply contact head to receive a power supply from outside of the casing;
the signal boost circuit comprises a first input terminal, a second input terminal, a first output terminal, a second output terminal, a ground terminal, and a power input terminal, wherein the first input terminal is connected to the first conductive contact head, the second input terminal is connected to the second conductive contact head, the ground terminal is connected to the third conductive contact head, the power input terminal is connected to the fourth conductive contact head, and the signal boost circuit acquires the differential signal over the first input terminal and the second input terminal and performs signal amplification processing; and
the second interface comprises a fifth conductive contact head, a sixth conductive contact head, and a seventh conductive contact head, wherein the fifth conductive contact head is connected to the first output terminal, the sixth conductive contact head is connected to the second output terminal, the seventh conductive contact head is connected to the ground terminal, and the fifth conductive contact head and the sixth conductive contact head output the differential signal experiencing signal amplification processing performed by the signal boost circuit.

3. The connector according to claim 2, wherein a coupling capacitor is arranged between the fifth conductive contact head and the first output terminal, and between the sixth conductive contact head and the second output terminal, so as to perform direct-current blocking for the differential signal experiencing signal amplification processing.

4. The connector according to claim 2, wherein a voltage value of the power supply is 1.8 V or 3.3 V.

5. A connector, comprising:
a first interface, a second interface, and a signal boost circuit, wherein at least one of the first interface and the second interface comprises a power supply contact head configured to connect to a power supply outside the connector to power the signal boost circuit;
a casing, wherein the signal boost circuit is arranged inside the casing and concatenated between the first interface and the second interface, the signal boost circuit performs signal amplification processing on a differential signal received by the first interface and outputs the signal over the second interface, and the first interface and the second interface are arranged on different surfaces outside the casing;
the first interface comprises a first conductive contact head, a second conductive contact head, and a third conductive contact head, wherein the first conductive contact head and the second conductive contact head are configured to receive the differential signal from outside of the casing, and the third conductive contact head is configured to receive a ground signal from outside of the casing;
the signal boost circuit comprises a first input terminal, a second input terminal, a first output terminal, a second output terminal, a ground terminal, and a power input terminal, wherein the first input terminal is connected to the first conductive contact head, the second input terminal is connected to the second conductive contact head, the ground terminal is connected to the third conductive contact head, and the signal boost circuit acquires the differential signal over the first input terminal and the second input terminal and performs signal amplification processing; and
the second interface comprises a fifth conductive contact head, a sixth conductive contact head, a seventh conductive contact head, and an eighth conductive contact head, wherein the fifth conductive contact head is connected to the first output terminal, the sixth conductive contact head is connected to the second output terminal, the seventh conductive contact head is connected to the ground terminal, the fifth conductive contact head and the sixth conductive contact head output the differential signal experiencing signal amplification processing performed by the signal boost circuit, and the eighth conductive contact head is connected to the power input terminal as the power supply contact head, and is configured to receive the power supply from outside of the casing.

6. The connector according to claim 5, wherein a coupling capacitor is arranged between the fifth conductive contact head and the first output terminal, and between the sixth conductive contact head and the second output terminal, so as to perform direct-current blocking for the differential signal experiencing signal amplification processing.

7. The connector according to claim 5, wherein a voltage value of the power supply is 1.8 V or 3.3 V.

8. An electronic device, comprising a first circuit board, a second circuit board, and a connector, wherein the connector comprises:
a first interface, a second interface, and a signal boost circuit, wherein at least one of the first interface and the second interface comprises a power supply contact head, and the power supply contact head is configured to connect to a power supply outside the connector to power the signal boost circuit; and
a casing, wherein the signal boost circuit is arranged inside the casing and concatenated between the first interface and the second interface, the signal boost circuit performs signal amplification processing on a differential signal received by the first interface and outputs the signal over the second interface, and the first interface and the second interface are arranged on different surfaces outside the casing; and
a power output terminal is arranged on at least one of the first circuit board and the second circuit board, and the power supply contact head is connected to the power output terminal to acquire a power supply from the power output terminal to power the signal boost circuit.

9. The electronic device according to claim 8, wherein:
the first interface comprises a first conductive contact head, a second conductive contact head, a third conductive contact head, and a fourth conductive contact head, wherein the first conductive contact head and the second conductive contact head are configured to receive the differential signal from the first circuit board, the third conductive contact head is configured to receive a ground signal from the first circuit board, and the fourth conductive contact head serves as the power supply contact head to receive a power supply that is output by the power output terminal of the first circuit board;
the signal boost circuit comprises a first input terminal, a second input terminal, a first output terminal, a second output terminal, a ground terminal, and a power input terminal, wherein the first input terminal is connected to the first conductive contact head, the second input terminal is connected to the second conductive contact head, the ground terminal is connected to the third conductive contact head, the power input terminal is connected to the fourth conductive contact head, and the signal boost circuit acquires the differential signal over the first input terminal and the second input terminal and performs signal amplification processing; and
the second interface comprises a fifth conductive contact head, a sixth conductive contact head, and a seventh conductive contact head, wherein the fifth conductive contact head is connected to the first output terminal, the sixth conductive contact head is connected to the second output terminal, the seventh conductive contact head is connected to the ground terminal and receives a ground signal from the second circuit board, and the fifth conductive contact head and the sixth conductive contact head output the differential signal experiencing signal amplification processing performed by the signal boost circuit to the second circuit board.

10. The electronic device according to claim 9, wherein a coupling capacitor is arranged between the fifth conductive contact head and the first output terminal, and between the sixth conductive contact head and the second output terminal, so as to perform direct-current blocking for the differential signal experiencing signal amplification processing.

11. The electronic device according to claim 9, wherein a voltage value of the power supply is 1.8 V or 3.3 V.

12. The electronic device according to claim 8, wherein:
the first interface comprises a first conductive contact head, a second conductive contact head, a third conductive contact head, wherein the first conductive contact head and the second conductive contact head are configured to receive the differential signal from the first circuit board, and the third conductive contact head is configured to receive a ground signal from the first circuit board;
the signal boost circuit comprises a first input terminal, a second input terminal, a first output terminal, a second output terminal, a ground terminal, and a power input terminal, wherein the first input terminal is connected to the first conductive contact head, the second input terminal is connected to the second conductive contact head, the ground terminal is connected to the third conductive contact head, and the signal boost circuit acquires the differential signal over the first input terminal and the second input terminal and performs signal amplification processing; and the second interface comprises a fifth conductive contact head, a sixth conductive contact head, a seventh conductive contact head, and an eighth conductive contact head, wherein the fifth conductive contact head is connected to the first output terminal, the sixth conductive contact head is connected to the second output terminal, the seventh conductive contact head is connected to the ground terminal and receives a ground signal from the second circuit board, the fifth conductive contact head and the sixth conductive contact head output the differential signal experiencing signal amplification processing performed by the signal boost circuit to the second circuit board, and the eighth conductive contact head serves as the power supply contact head to receive the power supply that is output by the power output terminal of the second circuit board.

13. The electronic device according to claim 12, wherein a coupling capacitor is arranged between the fifth conductive contact head and the first output terminal, and between the sixth conductive contact head and the second output terminal, so as to perform direct-current blocking for the differential signal experiencing signal amplification processing.

14. The electronic device according to claim 12, wherein a voltage value of the power supply is 1.8 V or 3.3 V.

15. A connector, comprising at least one conductor assembly, a casing, and a signal boost circuit, wherein the signal boost circuit is arranged inside the casing, the conductor assembly comprises several conductors, and at least one conductor in the conductor assembly is connected to a power supply outside the casing and powers the signal boost circuit wherein the signal boost circuit comprises, a first input terminal and a second input terminal configured to receive an input differential signal, a first output terminal and a second output terminal configured to output an output processed differential signal generated from the input differential signal, and a ground terminal and a power input terminal configured to provide power to the signal boost circuit.

16. The connector according to claim 15, wherein the conductor assembly comprises four conductors, one conductor powers the signal boost circuit, one conductor is connected to ground, two conductors transmit differential signals, and the signal boost circuit boosts the differential signals.

* * * * *